(12) United States Patent
Höft et al.

(10) Patent No.: US 10,389,299 B2
(45) Date of Patent: Aug. 20, 2019

(54) SAFE PHOTOVOLTAIC SYSTEM

(71) Applicant: Phoenix Contact GmbH & Co. KG, Blomberg (DE)

(72) Inventors: Wolfgang Höft, Barntrup (DE); Martin Jankowski, Seelze (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 458 days.

(21) Appl. No.: 14/766,493

(22) PCT Filed: Feb. 11, 2014

(86) PCT No.: PCT/EP2014/052663
§ 371 (c)(1),
(2) Date: Aug. 7, 2015

(87) PCT Pub. No.: WO2014/122325
PCT Pub. Date: Aug. 14, 2014

(65) Prior Publication Data
US 2015/0381108 A1    Dec. 31, 2015

(30) Foreign Application Priority Data

Feb. 11, 2013   (DE) .................. 10 2013 101 314

(51) Int. Cl.
*H02H 7/26*    (2006.01)
*H02S 40/34*    (2014.01)
(Continued)

(52) U.S. Cl.
CPC ............ *H02S 50/10* (2014.12); *G01R 31/026* (2013.01); *H02H 3/08* (2013.01); *H02H 3/20* (2013.01);
(Continued)

(58) Field of Classification Search
CPC .......... H02H 7/20; H02H 7/268; H02H 11/00; H02H 3/20; H02H 3/08; H02S 40/34
(Continued)

(56) References Cited

U.S. PATENT DOCUMENTS 6,650,031 B1    11/2003   Goldack
7,772,716 B2    8/2010    Shaver, II et al.
(Continued)

FOREIGN PATENT DOCUMENTS

AU    2012225199 A1    10/2013
CN    101951190 A       1/2011
(Continued)

OTHER PUBLICATIONS

Chinese Office Action (English Language Translation), Application No. 201480019926.3, Applicant: Phoenix Contact GmbH & Co. KG, Title: Safe Photovoltaic System, dated Jun. 3, 2016.
(Continued)

*Primary Examiner* — Susan D Leong
*Assistant Examiner* — Dujuan A Horton
(74) *Attorney, Agent, or Firm* — Reising Ethington PC

(57) ABSTRACT

A photovoltaic system includes at least one string of solar modules and a system for individually disconnecting the solar modules and for safely connecting or reconnecting the disconnected solar modules to the string. At least some of the solar junction boxes are "smart" and have a safety circuit that defines an operating state and a safe state. The solar junction boxes are switched from the safe state to the operating state, i.e. are activated, by injecting a starting current.

26 Claims, 9 Drawing Sheets

(51) Int. Cl.

| | |
|---|---|
| *H02S 50/10* | (2014.01) |
| *H02H 7/20* | (2006.01) |
| *H02H 11/00* | (2006.01) |
| *H02S 50/00* | (2014.01) |
| *H02H 3/08* | (2006.01) |
| *H02H 3/20* | (2006.01) |
| *G01R 31/02* | (2006.01) |

(52) U.S. Cl.
CPC .............. *H02H 7/20* (2013.01); *H02H 7/268* (2013.01); *H02H 11/00* (2013.01); *H02S 50/00* (2013.01)

(58) Field of Classification Search
USPC ..................... 136/243–265; 361/88, 90, 91.1
See application file for complete search history.

(56) References Cited

U.S. PATENT DOCUMENTS

| | | |
|---|---|---|
| 8,809,699 B2 | 8/2014 | Funk |
| 8,859,884 B2 | 10/2014 | Dunton et al. |
| 8,963,375 B2 | 2/2015 | DeGraaff |
| 2008/0106250 A1 | 5/2008 | Prior et al. |
| 2009/0014057 A1 | 1/2009 | Croft et al. |
| 2009/0141522 A1 | 6/2009 | Kdest et al. |
| 2009/0207543 A1 | 8/2009 | Boniface et al. |
| 2010/0043870 A1 | 2/2010 | Bennett et al. |
| 2010/0139734 A1 | 6/2010 | Hadar et al. |
| 2010/0241375 A1 | 9/2010 | Kumar et al. |
| 2010/0300508 A1 | 12/2010 | Maier et al. |
| 2010/0317782 A1 | 12/2010 | Hattori et al. |
| 2010/0321148 A1 | 12/2010 | Gevorkian |
| 2011/0172842 A1 | 7/2011 | Makhota et al. |
| 2012/0050924 A1 | 3/2012 | Matsuo et al. |
| 2012/0194003 A1 | 8/2012 | Schmidt et al. |
| 2013/0015875 A1 | 1/2013 | Kumar |
| 2013/0051092 A1 | 2/2013 | Cooper et al. |
| 2014/0137920 A1 | 5/2014 | Berg |
| 2014/0301003 A1 | 10/2014 | Jankowski |
| 2014/0311546 A1 | 10/2014 | Kruse et al. |
| 2015/0008748 A1 | 1/2015 | Deboy et al. |
| 2016/0006392 A1 | 1/2016 | Hoft |
| 2016/0018456 A1 | 1/2016 | Yilmaz |
| 2017/0338770 A1 | 11/2017 | Higuchi et al. |

FOREIGN PATENT DOCUMENTS

| | | |
|---|---|---|
| CN | 201918923 U | 8/2011 |
| CN | 201927619 U | 8/2011 |
| CN | 102598287 A | 7/2012 |
| CN | 103081269 A | 5/2013 |
| DE | 19844977 A1 | 4/2000 |
| DE | 102007037130 B3 | 4/2009 |
| DE | 102009051186 | 5/2010 |
| DE | 102009022569 A1 | 12/2010 |
| DE | 102010023549 A1 | 12/2011 |
| DE | 102010054354 | 6/2012 |
| DE | 102011079074 A1 | 1/2013 |
| DE | 102011107365 | 3/2013 |
| DE | 102013101314 A1 | 8/2014 |
| EP | 2256819 A1 | 12/2010 |
| JP | 2006278755 A | 10/2006 |
| WO | 2009073868 | 6/2009 |
| WO | 2010078303 | 7/2010 |
| WO | 2010078303 A2 | 7/2010 |
| WO | 2011023732 | 3/2011 |
| WO | 2011023732 A2 | 3/2011 |
| WO | 2011079074 | 6/2011 |
| WO | 2012079742 A1 | 6/2012 |
| WO | 2013000762 A2 | 1/2013 |
| WO | 2013007638 A2 | 1/2013 |
| WO | 2013010083 A2 | 1/2013 |

OTHER PUBLICATIONS

German Office Action, Applicant: Phoenix Contact GmbH & Co. KG, Serial No. 10 2011 110 682.4, dated Apr. 22, 2014.
U.S. Appl. No. 14/239,285, filed Apr. 11, 2014, First Named Inventor: Martin Jankowski, dated Dec. 31, 2015.
Moser Taboada Attorneys at Law Letter, Mail Date: Jul. 7, 2015, Re: U.S. Appl. No. 14/239,285, Entitled: Socket for a Solar Panel with a Protective Circuit.
International Search Report and Written Opinion, Int. Serial No. PCT/EP2012/003459, Int. Filing Date: Aug. 14, 2012, Applicant: Phoenix Contact GmbH & Co. KG, dated Dec. 21, 2012.
International Search Report and Written Opinion, Int. Serial No. PCT/EP2014/052666, Int. Filing Date: Feb. 11, 2014, Applicant: Phoenix Contact GmbH & Co. KG, dated May 15, 2014.
China Office Action, Application No. 201280040488.X, Applicant: Phoenix Contact GmbH & Co. KG, Title: Socket for a Solar Panel with a Protective Circuit, dated Aug. 5, 2015.
Search result from the German Patent and Trademark Office, dated Nov. 18, 2014.
German Office Action, Applicant: Phoenix Contact GmbH & Co. KG, Serial No. 10 2015 114 755.6, dated May 20, 2016.
U.S. Office Action, U.S. Appl. No. 14/766,516, Applicant: Phoenix Contact GmbH & Co. KG, dated Aug. 9, 2017.
Chinese Office Action, Application No. 201480019920.6, Applicant: Phoenix Contact GmbH & Co. KG, Title: Safe Photovoltaic System, dated Mar. 3, 2017.
International Search Report and Written Opinion, Int. Serial No. PCT/EP2014/052663, Int. Filing Date: Feb. 11, 2014, Applicant: Phoenix Contact GmbH & Co. KG, dated May 26, 2014.
German Office Action, Serial No. 10 2013 101 314.7, Applicant: Phoenix Contact GmbH & Co. KG, dated Dec. 20, 2013.
PCT English Translation of International Preliminary Examination Report, Int. Application No. PCT/EP2014/052663, Int. Filing Date: Feb. 11, 2014, Applicant: Phoenix Contact GmbH & Co. KG, dated Aug. 11, 2015.
Chinese Office Action, Application No. 201480019926.3, Applicant: Phoenix Contact GmbH & Co. KG, Title: Safe Photovoltaic System, dated Jun. 3, 2016.
English Translation of Int. Preliminary Report on Patentability, Int. Serial No. PCT/EP2012/003459, Int. Filing Date: Aug. 14, 2012, Applicant: Phoenix Contact GmbH & Co. KG, et al., dated Feb. 25, 2014.
Chinese Office Action, Application No. 201680061131.8, Filing Date: Aug. 31, 2016, Applicant: Phoenix Contact GmbH & Co. KG, Dated: Mar. 22, 2019.
Chinese Office Action, Application No. 201680061131.8, Applicant: Phoenix Contact GmbH & Co. KG, Title: Safe Photovoltaic System, Date of Notification Apr. 1, 2019.

SAFE PHOTOVOLTAIC SYSTEM

TECHNICAL FIELD

The present disclosure relates to a photovoltaic system including at least one string of series-connected solar modules and a system for individually disconnecting solar modules and for safely reconnecting the disconnected solar modules to the string.

BACKGROUND

Hitherto, solar modules often have not been equipped with special safety provisions. The solar connection box (also known as solar junction box) provided on each solar module is essentially used to accommodate the mechanical connections of the conductive strips (also known as conductor ribbons) of the solar module and the bypass diodes thereof. Such simple solar modules will supply voltage as soon as they are illuminated.

Typically, the solar modules are series-connected so as to form strings in order to obtain a high string voltage. This voltage of the solar modules connected into strings can amount to several 100 V, and in large systems voltages of about 1000 V or even more may be present, which is a hazardous voltages being touched. Also, a solar power system optionally comprises a plurality of strings connected in parallel.

Thus, in case of adequate illumination very high voltages might be generated during the installation of solar modules and when electrically connecting them in the string, so that cautious handling and a special contact protection is required. The same applies to maintenance works.

In such simple photovoltaic systems the first possibility for disconnecting the solar generator voltage from the power grid is at the string combiner box. Therefore, in case of damage caused by fire, water, hail or in case of other malfunctions of the solar modules or the string lines there is no way for these simple solar modules to de-energize or disconnect the part of the photovoltaic system that includes the solar modules and the string lines from voltage.

Safety devices for switching off the individual solar modules in case of fire or faults are known (e.g. DE 10 2009 024 516 A1). However, such solutions are usually only intended for a single emergency shutdown.

DE 10 2011 110 682 (not pre-published) discloses a junction box which switches from the operating state to a safe state in case of a deviation of the allowed parameters.

As an enhancement of the invention described in DE 10 2011 110 682, the present disclosure relates in particular to a controlled and safe initial connection or starting of a photovoltaic system using "smart" solar junction boxes and to a safe and controlled reconnection or restarting after a shutdown of the solar junction boxes, for example after incidents, maintenance work, or at sunrise. The content of DE 10 2011 110 682 is hereby fully incorporated by reference.

WO 2010/078303 describes a signal generator which continuously applies an RF enable signal to the positive and negative branch of a PV string. The disadvantage here is that the RF enable signal must be applied permanently to maintain the system in the operation state, and that the PV modules possibly will not provide electric power for components in the junction box or will require additional RF signal bypasses and do not ensure reliable prevention of open voltages. Furthermore, power loss or additional power consumption may be caused by the enable signal generator. In case of a malfunction of the RF enable signal, PV modules or even the entire PV string may be unnecessarily shut down, which may result in reduced power feed to the grid.

SUMMARY

Therefore, it is an object of the present disclosure to provide a photovoltaic system which meets high safety requirements and which in particular provides for safe disconnection or deactivation in the event of a fault and for controlled initial connection or starting after installation, and for reconnection or restarting, for example after faults, maintenance work, or at sunrise.

Another aspect of the object is to ensure that the electrical circuit of the string is closed when the solar modules apply photovoltaically generated voltage to the string, so that so-called open voltages are prevented from being applied at possibly open contacts in case the circuit is not closed, and so that the efficiency of the photovoltaic system is optimized and power loss is minimized.

Other objects will become apparent from the following description and the specific advantages obtained with specific embodiments.

The object is achieved by the subject matter of the independent claims. Various other embodiments are defined in the dependent claims.

The photovoltaic system comprises at least one string of solar modules connected in series and a system for individually disconnecting or deactivating the solar modules and for safe initial connection or starting or reconnection or restarting of the disconnected or deactivated solar modules to the string. Of course, a plurality of strings may be provided and may be connected in parallel. The solar modules each comprise a connection box (also referred to as (solar) junction box), which is typically mounted to the associated solar module on the rear side of the associated solar module, for example glued thereto, and which has input-side positive and negative connection elements, typically in form of contact terminals, by means of which the voltage-carrying conductor strips (also referred to as ribbons) of the positive and negative poles of the associated solar module, which extend from the surface of the solar module are electrically connected in the solar junction box. The solar junction boxes provide a connection between the string lines and the voltage-carrying conductor ribbons of the associated solar module. Therefore, the solar junction boxes further comprise output-side positive and negative connection elements which are electrically connected to the respective input-side connection element inside the solar junction box. The string line is composed of connecting cables which connect the solar modules of the string in series and which are connected to the positive and negative output-side connection elements of the solar junction boxes for this purpose. Depending on the embodiment, the connecting cables are electrically connected within the solar junction box, or the output-side positive and negative connection elements are provided in form of plug-in connectors and the connecting cables have plug-in connectors mateable therewith, so that the connecting cables can be plugged into the solar junction box on site. Accordingly, the solar modules are connected in series to form the string by means of the string line connected to the output-side positive and negative connection elements. In this way, the string line forms an electrical circuit comprising the series-connected solar modules and an inverter.

According to the present disclosure, at least one of the solar junction boxes has a safety circuit. The safety circuit defines an operating state of the solar module with the associated solar junction box in which the solar power generated by the associated solar module is fed through the solar junction box via the output-side connection elements and the string line to the inverter and thus to the power grid, and defines a safe state of the solar module with the associated solar junction box in which the associated solar module is deactivated or disconnected from the string line by means of the safety circuit. A solar junction box that includes such a safety circuit will be referred to as "smart solar junction box" below. Ideally, all or at least almost all solar modules have such a smart solar junction box, so that all or almost all solar modules of the string can be disconnected or deactivated individually, which guarantees safety during initial installation of the photovoltaic system, during maintenance and repair works, and in the event of an incident such as fire, since in such a case only a few or even none of the solar modules will apply a voltage to the string line. The smart solar junction boxes may even be configured so as to disconnect or deactivate solar modules in case of shadowing or at night.

However, after such disconnection or deactivation the solar modules have to be re-enabled or restarted, i.e. have to be electrically reconnected to the string. For this purpose, according to the present disclosure a starter circuit is provided which is adapted to inject a starting current into the string line. In the safe state, the smart solar junction boxes close the electrical circuit of the string, despite the disconnected or deactivated solar modules, preferably by means of short-circuiting switches which short-circuit the output-side positive and negative connection elements in the safe state.

Furthermore, the safety circuits of the smart solar junction boxes are configured so as to switch from the safe state to the operating state in response to the starting current injected into the string line, i.e. preferably to open the short-circuiting switch in the respective smart solar junction box, and/or to electrically connect the solar module to the string line and to start the string or the photovoltaic system in this way. In the safe state, the injected starting current will flow or run through the serial string line and the solar junction boxes, so that it is ensured that the string line is closed and no hazardous open voltage will be produced upon reconnection.

In a simple example, the starting current is a constant current which is measured by the safety circuit of the smart solar junction boxes, and in response thereto the safety circuit switches from the safe state to the operating state. However, the starting current may as well be pulsed, i.e. provided in form of one or more current pulses. It is even possible to transfer additional information that have an influence on the operational behavior of the safety circuit to the smart solar junction boxes through the current level and/or pulse shape. The starting current may even contain higher coded information, e.g. in a signal encoded by current pulses, or a higher level communication may be effected via the string, e.g. power-line, by modulating and thereby injecting appropriate starting signals to the string line. For reconnection it is nevertheless ensured that the starting current can only flow through the string line if the latter is not interrupted, so that upon reconnection no open voltage that would be hazardous upon contact can occur.

The present disclosure thus provides not only the possibility to disconnect individual solar modules from the string, but also provides a way for safely connecting or reconnecting the individually disconnected solar modules using the "smart" solar junction boxes. Other safety or functionality related parameters, such as module voltage, string voltage, and/or module temperature may additionally be monitored in the smart solar junction boxes and the switching of the safety circuit between the safe state and the operating state may be controlled in response thereto.

According to one embodiment, the starter circuit is accommodated in a start box that is separately connected to the string line and is in particular connected to the string line in series with the solar modules. The start box is preferably disposed in the vicinity of the inverter, or in case of a residential system inside the building so as to be accessible to the user, so that the switching operations of the smart solar junction box can be initialized easily. Also, maintenance and replacement of the start box are simplified in this way.

According to a simple embodiment, the starter circuit comprises a switch connected in series with respect to the string line, which switch is closed to close the electrical circuit of the string line including the starter circuit and to cause the starting current to flow or the start signal to run in the so closed electrical circuit of the string line and the solar modules. The so closed electrical circuit composed of the string line with the solar modules and starter circuit is preferably connected in parallel to the inverter, i.e. bypasses the inverter. In other words, the starter circuit in the string preferably defines a bypass with respect to the inverter, or the starter circuit is connected to the string line in series with the solar modules and as shunt to the inverter.

The safety switch in the smart solar junction boxes comprises a short-circuiting switch connected between the output-side positive and negative connection elements in parallel with the associated solar module, and comprises an isolating switch connected in series in the string. The short-circuiting switch is closed in the safe state thereby short-circuiting the output-side positive and negative connection elements of the solar junction box. The isolating switch or disconnector switch is open in the safe state thereby disconnecting the short-circuiting switch from the solar module, at least on one side. In the operating state, the short-circuiting switch is open and the isolating switch is closed, allowing to supply the photovoltaically generated power from the solar module without loss. In the operating state, the string line is closed through the solar modules. The short-circuiting switch, however, ensures that the string line is closed in the safe state, although the solar modules are disconnected from the string line. Furthermore, the disconnection of the solar module from the short-circuiting switch in the safe state ensures that the safety circuit is powered by the associated solar module even in the safe state, provided that enough light illuminates the solar module.

Preferably, the solar junction box has a central bypass circuit, in particular a central bypass diode which is connected in parallel to the short-circuiting switch. The central bypass circuit additionally prevents damage to the associated solar module in the case of shadowing, in the usual manner.

In particular, the safety circuit comprises an electronic control device, such as in form of a microcontroller which is accommodated in the respective solar junction box and controls the switching between the safe state and the operating state of the safety circuit in response to the starting current or the start signal injected into the string line, i.e. in particular controls the isolating switch and/or the short-circuiting switch by opening the short-circuiting switch and/or closing the isolating switch when the smart solar junction box switches from the safe state to the operating state. For this purpose, the microcontroller is powered by the solar module not only in the operating state but also in the safe state, in order to be able to control the switching operations.

The safety circuit includes a current sensor which measures (detects, in the simplest case) the starting current injected into the string line. The control device reads the current sensor for automatically switching the safety circuit from the safe state to the operating state in response to the measurement result, and for this purpose the electric power for operating the controller is in particular again supplied by the associated disconnected solar module.

When the string of the photovoltaic system is desired to be switched on, i.e. the safety circuits of the solar modules are to be switched from the safe state to the operating state, the starting current is injected into the string line and is measured or detected by the current sensor of the respective safety circuit at the solar modules. In the safe state, the starting current flows through the short-circuiting switches of the safety circuits. However, the starting current can only flow through the string line when the string line is closed. In other words, the starting current cannot flow through the string line when the string line is interrupted, for example due to a fault, or is otherwise open. Thus, as a result of the measurement or detection of the starting current flowing through the electrical circuit of the closed string line and of the automatic connection in response to the associated measurement or detection result, all safety circuits in the string are only able to automatically connect when the electrical circuit of the string line is closed and is not open, especially not interrupted.

Preferably, the safety circuit in the smart solar junction boxes is adapted to automatically switch from the operating state to the safe state when the associated solar module is shadowed or in general darkness which is accompanied by a drop in module voltage below a predefined threshold. Preferably, for this purpose, the short-circuiting switch is provided in form of a normally closed switch which is closed in the normal state, and/or the isolating switch is provided in form of a normally open switch which is open in the normal state. This ensures that the safety circuit automatically switches to the safe state when the power provided by the associated solar module is no longer sufficient to power the control device, for example when it is getting dark. In other words, in the safe state the short-circuiting switch and the isolating switch are in the normal state and have to be activated by the control device in order to switch from the normal safe state into the operating state in response to the activation of the safety circuit. Accordingly, the safe state is the normal state of the safety circuit and switching from the normal safe state into the operating state requires an active starting operation. This increases the safety of the photovoltaic system.

Furthermore preferably, the solar junction box comprises at least one of the following devices:
 a first voltage sensor which measures the module voltage of the associated solar module;
 a second voltage sensor which measures the string voltage;
 a temperature sensor which monitors the temperature of the associated solar module;
wherein the control device reads out the first voltage sensor and/or the second voltage sensor and/or the temperature sensor and controls the safety circuit in response thereto. In particular, the safety circuit automatically switches to the safe state when one or more of these values fall outside predetermined interval thresholds. For example, during normal operation the inverter sets the current and voltage to the point of maximum power (also known as "Maximum Power Point", or "MPP"). When, for example, the values measured by the current sensor and by the first and/or second voltage sensors deviate therefrom, the safety circuit will automatically switch to the safe state. Accordingly, the current sensor has a double function: in the safe state it measures or detects the injected starting current or the start signal, and in the operating state it measures the solar power fed into the string.

According to an embodiment, all solar modules of a string comprise a smart solar junction box including the safety circuit as defined above. Especially in this embodiment the starter circuit or the start box comprises its own current source for generating the starting current.

Preferably, the short-circuiting switch in the solar junction box is arranged in front of or upstream of the output-side positive and negative connection elements as seen from the positive and negative poles of the solar module, and the isolating switch in the solar junction box is connected in series between the input-side connection element of the voltage-carrying conductor of the positive pole of the solar module and the output-side positive connection element, or is connected in series between the input-side connection element of the voltage-carrying conductor of the negative pole of the solar module and the output-side negative connection element (or the associated port of the short-circuiting switch).

The isolating switch is preferably connected in series with the central bypass circuit, and/or the short-circuiting switch is connected in parallel to the central bypass circuit.

Preferably, the solar junction box has input-side intermediate connection elements for intermediate taps on the solar module and a plurality of sub-module bypass circuits, in particular sub-module bypass diodes to compensate for partial shadowing of the associated solar module, and the sub-module bypass circuits are connected in front of or upstream of the isolating switch and the short-circuiting switch as seen from the poles of the solar module, so that the sub-module bypass circuits remain connected to the solar module even in the safe state.

Preferably, the starter circuit has its own current source independent of the solar modules, and the starting current or the start signal injected into the string line is supplied by this own current source. The current source is for example provided in form of a power supply unit and/or may be integrated in the start box or may be externally connected to the start box. Optionally, the current source of the starter circuit may be configured as an energy storage device which during normal operation stores energy photovoltaically generated by the string and in the starting mode supplies the starting current or the start signal using the so stored energy.

Preferably, the starter circuit has at least a first switch by means of which, for starting the string, an electrical circuit is closed in parallel to the inverter in the string in order to cause the starting current to flow or the start signal to run in the so closed electrical circuit of the string line so as to switch the safety circuits of the solar junction boxes of the string from the safe state to the operating state, i.e. to start the string.

Further preferably, the starter circuit includes at least one isolating switch by means of which the inverter is disconnected from the string for starting the string.

For injecting the starting current or the start signal into the string line, i.e. for starting the string (start mode), the isolating switch is open and the first switch is closed so that the electrical circuit of the string line is closed. In the start mode, the starter circuit accordingly forms a shunt to the (disconnected) inverter, and the current source for the starting current or start signal forms a closed electrical circuit with the solar modules in order to inject the starting current or start signal via this circuit into the string line to cause it to pass through the solar junction boxes. Therefore, the first switch is also referred to as a shunt switch herein.

The isolating switch is connected in series with the inverter for disconnecting the latter from the string in the start mode of the starter circuit. In the embodiment in which the starter circuit has an own current source, the first switch is preferably connected in series with the own current source and/or the isolating switch is connected in parallel with the own current source.

During normal operation of the photovoltaic system during which the safety circuits of the solar junction boxes are in the operating state, the isolating switch of the starter circuit is closed and the first switch or shunt switch of the starter circuit is open so that the power feed of the generated solar power is not affected. In other words, during normal operation of the photovoltaic system the shunt to the inverter defined by the starter circuit is open. In this way, unnecessary power loss or energy consumption is avoided. The operating state is inherently stable in the sense that no continuous enable signal from the starter circuit is required to keep the string or the PV system in the operating state. In the operating state the starter circuit is switched to passage and does not need to feed a continuous enable signal into the string. Thus, the string is designed to be bistable, since the operating state and the safe state are each inherently stable with respect to the starter circuit, i.e. although the starter circuit causes the switching from the safe state to the operating state, the starter circuit is not needed to actively maintain the operating state. This makes the system less susceptible to failure and unnecessary shutdowns to the safe state can possibly be avoided.

Furthermore preferably, the starter circuit comprises an electronic controller, e.g. microcontroller that has an electronic interface and/or an external enable switch, and the controller controls the injection of the starting current or start signal into the string line in response to an enable signal at the electronic interface and/or in response to an actuation of the enable switch.

It is moreover preferable if the controller has at least one signal output which signals the safe state and/or an error state, e.g. via a light emitting diode. However, the controller may as well have an electronic interface which forwards the safe state and/or an error state, e.g. to a central computer.

Preferably, the solar junction box includes at least an anti-theft means, a maximum power point tracking (MPPT) controller, a voltage monitoring means, a current monitoring means, and/or a temperature monitoring means which are connected in front of or upstream of the isolating switch and the short-circuiting switch as seen from the poles of the solar module, and the anti-theft means, the MPPT controller, the voltage monitoring means, the current monitoring means, and the temperature monitoring means are powered by the associated solar module even in the safe state.

Preferably, the starter circuit comprises at least one of the following components:
  a current sensor for measuring the string current; and/or
  a voltage sensor for measuring the string voltage; and/or
  means for measuring the string power; and/or
  means for detecting arcing in the string; and/or
  means for theft detection in the string; and/or
  an interface to output the corresponding values or an appropriate signaling.

This information may as well be relayed via the interface of the controller, for example to a central computer.

According to another embodiment, at least one solar module of a string has a solar junction box without the safety circuit, which means that this solar junction box is not "smart" in the above sense, so that this solar module will not be set to a safe state but will permanently remain connected to the string. In this case, the solar voltage fed by this solar module having a non-smart solar junction box can be used for injecting the starting current or start signal into the string line to effect the switching of the safety circuits of the other solar modules from the safe state to the operating state. Therefore, optionally, the power supply unit of the starter circuit can be dispensed with. Namely, in this case the non-smart solar module will feed solar power into the string line, e.g. at sunrise, while the smart solar modules are still disconnected. The disconnected smart solar modules may then be triggered by means of this solar power to switch from the safe state to the operating state.

The present disclosure further relates to the start box including the starter circuit, which is configured for being connected to the string line of a photovoltaic system and for injecting the starting current or start signal into the string line to cause the safety circuit to switch from the safe state to the operating state, and also relates to the smart solar junction box and the solar module comprising such a smart solar junction box according to the present disclosure.

Another aspect of the present disclosure is the method for safely starting the string of series-connected solar modules.

In the safe state, the solar modules are individually disconnected from voltage with respect to the string line, by the safety circuits. In response to the injection of the starting current or start signal into the string line, each safety circuit will connect the respective associated solar module to the string, so that subsequently the generated solar power can be supplied via the string.

The injection of the starting current or start signal is controlled by a central start box connected to the string, in response to:
  manual actuation of an enable switch on the start box, e.g. by the installing person after initial installation or after maintenance works; and/or
  remote-controlled starting of the starter circuit by transmitting a start signal to the electronic interface of the controller of the starter circuit, e.g. by the installing person after initial installation or after maintenance works; and/or
  automatic starting in response to a timer; and/or
  automatic starting in response to an evaluation of an irradiation sensor connected to the starter circuit, e.g. every morning after sunrise when light irradiation is sufficient for feeding photovoltaically generated power from the photovoltaic system into the power grid.

As already described above, the starting current or start signal injected into the string line is supplied by:
  an own current source of the starter circuit, e.g. an internal or external power supply unit or an energy storage device; and/or
  a solar module of the string having a solar junction box without the safety circuit described above, i.e. a non-smart solar module.

For injecting the starting current or start signal into the string line to cause the safety circuits in the solar junction boxes to switch from the safe state to the operating state, at least some of the following steps are performed in the starter circuit:

closing the shunt switch in the start box to close the electrical circuit of the string including the solar modules, and injecting the starting current or start signal into the string line and through the smart solar junction boxes;

measuring the string voltage in the start box;

when the string voltage exceeds a predefined threshold (for example, the predefined threshold is the starting voltage at the inverter), disconnecting the current source for injecting the starting current or start signal into the string from the string, in particular by opening the shunt switch of the start box;

closing the isolating switch to connect the inverter to the string; and/or charging an input capacitor at the inverter of the string until the charge/discharge curve of the input capacitor becomes flat.

The present disclosure will now be explained in more detail by way of exemplary embodiments and with reference to the figures in which the same and similar elements are partly denoted by the same reference numerals. The features of the various exemplary embodiments may be combined.

DETAILED DESCRIPTION OF THE PRESENT DISCLOSURE

Figure 1:
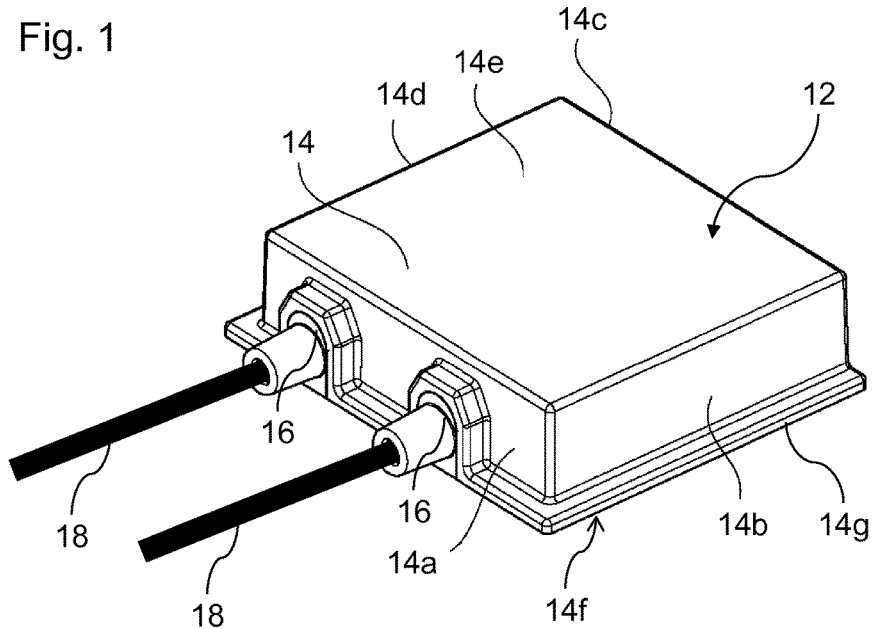
FIG. 1 is a perspective view of a typical solar junction box.

FIG. 1 shows a solar junction box 12 comprising a junction box housing 14 for being mounted on the rear side of a solar module. The dielectric junction box housing 14 has a hat-like shape, with circumferential side walls 14a to 14d and a cover 14e. On the bottom surface 14f of junction box housing 14, not visible in FIG. 1, openings are provided through which the conductor ribbons extending out of the solar module enter the solar junction box 12 to be electrically connected there. On one of the side walls, 14a, the junction box housing 14 has two cable feedthroughs 16 through which the string line 18 extends into the solar junction box 12 to be connected inside junction box housing 14, for example by means of contact terminals, not shown, in order to supply the electrical power generated by the solar module. A collar 14g serves to glue the solar junction box to the solar module. For the basic structural design of solar junction boxes reference is further made to DE 10 2007 037 130 A1 and DE 10 2007 042 547 A1.

Figure 2:
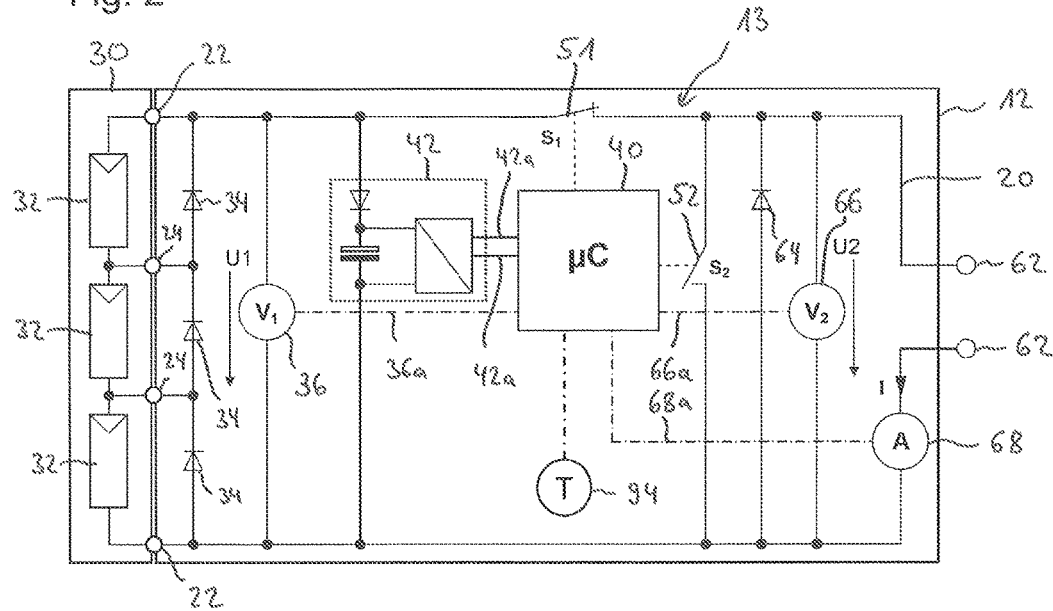
FIG. 2 shows a block diagram of a solar module comprising a smart solar junction box, in the operating state.

FIG. 2 shows a block diagram of solar junction box 12 which is connected to the respective conductor ribbons of the solar module 30 via input-side positive and negative connection elements 22 and, in this example, via two intermediate taps 24. Bypass diodes 34 are connected in parallel with the solar cells or solar sub-modules 32 in order to be able to compensate for partial shadowing of the solar module 30.

Solar junction box 12 comprises a safety circuit 13 which permits to switch the solar junction box 12 from the operating state or operating mode to the safe state or safety mode and vice versa and which will be described in more detail below.

A voltage sensor 36 ($V_1$) connected in parallel to the solar module 30 measures the module voltage U1 and is read out by a control device in form of a microcontroller 40 via link 36a. Furthermore, a power supply unit 42 is connected in parallel with the solar module 30 to power the microcontroller 40 via supply lines 42a, so that the microcontroller is able to control the solar junction box 12. A serial isolating switch 51 (S1) in solar junction box 12 is connected into string 20 in series with the solar module 30, and this isolating switch is closed in the operating state as illustrated in FIG. 2 in order to supply the power photovoltaically generated by the solar module 30 via string 20. Output-side positive and negative connection elements 62 can be short-circuited by a short-circuiting switch 52 (S2) in solar junction box 12, and this short-circuiting switch 52 is open in the operating state. A central bypass diode 64 between positive and negative connection elements 62 and short-circuiting switch 52 provides another bypass, for example in the event of a malfunction of short-circuiting switch 52.

An output-side voltage sensor 66 measures the string voltage (U2), independently of the switching state of switches 51 and 52, and this sensor 66 is read out by microcontroller 40 via link 66a. A current sensor 68 measures the string current during the operating state illustrated in FIG. 2, and also measures the starting current or detects the start signal during the safe state illustrated in FIG. 3, and this sensor 68 is read out by microcontroller 40 via link 68a. Microcontroller 40 reads input-side voltage sensor 36, output-side voltage sensor 66, and current sensor 68, and controls isolating switch 51 and short-circuiting switch 52 in response to the measured values.

Figure 3:
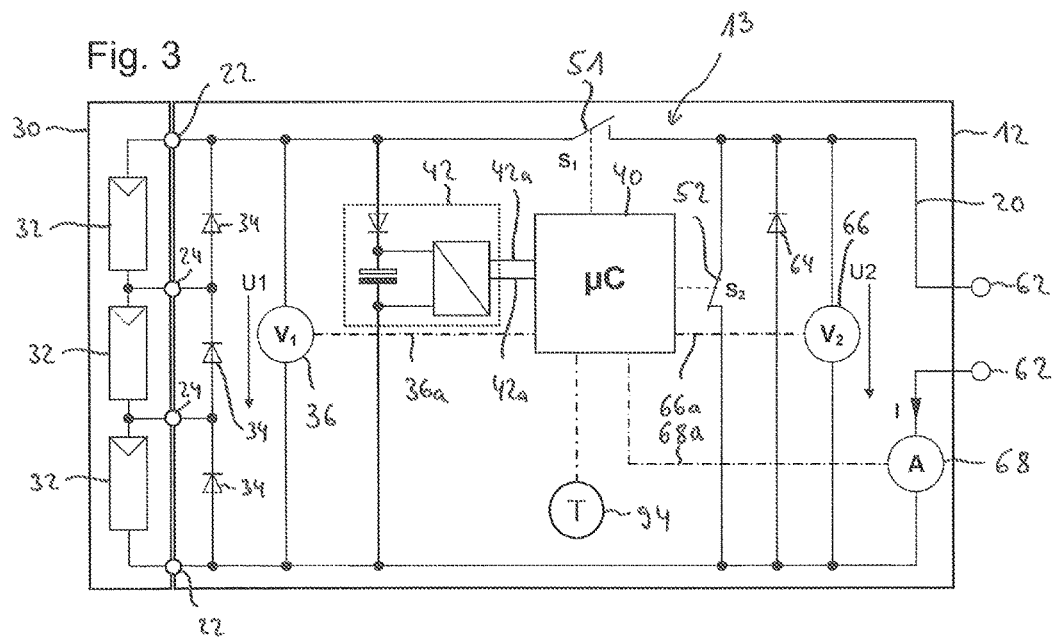
FIG. 3 shows the solar module of FIG. 2, but in the safe state.

FIG. 3 shows a block diagram of smart solar junction box 12 in the safe state. In the safe state the isolating switch 51 is open and the short-circuiting switch 52 is closed, so that the solar module 30 is disconnected from string 20 on the one hand, and on the other the string 20 is short-circuited by short-circuiting switch 52. Even in the safe state, power supply unit 42 is powered by the associated solar module 30, provided that solar module 30 is illuminated. Power supply unit 42 in turn powers microcontroller 40, so that the latter remains in operation even in the safe state, provided that illumination is sufficient. In other words, even in the safe state shown in FIG. 3, microcontroller 40 is able to read out the input-side and/or output-side voltage sensors 36, 66 and/or in particular current sensor 68, and/or to control switch 51 and/or 52. Preferably, isolating switch 51 is configured as a normally open switch, and/or short-circuiting switch 52 is configured as a normally closed switch, so that the safe state illustrated in FIG. 3 corresponds to the normal or non-actuated state of switches 51, 52. This has the benefit that at the latest when the solar module no longer supplies enough power for supplying microcontroller 40 with electric power, in the absence of sufficient illumination, the smart solar junction box 12 automatically switches to the safe state.

Now, when all solar junction boxes 12 of a string 20 are in the safe state this means that no photovoltaically generated current flows and the solar junction boxes will not readily come out of the safe state, even if for example the sun rises and illumination is sufficiently strong. If a plurality of solar junction boxes 12 would simply open the short-circuiting switch 52 and close the isolating switch 51 at the same time, this would lead to a situation where voltages hazardous upon contact might be produced.

Therefore, a problem on which the present disclosure is based is to ensure that the electrical circuit of string 20 is closed when the solar modules apply a photovoltaically generated voltage to the string, so that no so-called open voltage may exist at possibly open contacts when the circuit is not closed.

To this end, a starting current is injected from an external start box into the electrical circuit of string 20 which is closed even in the safe state of solar junction boxes 12.

Figure 4:
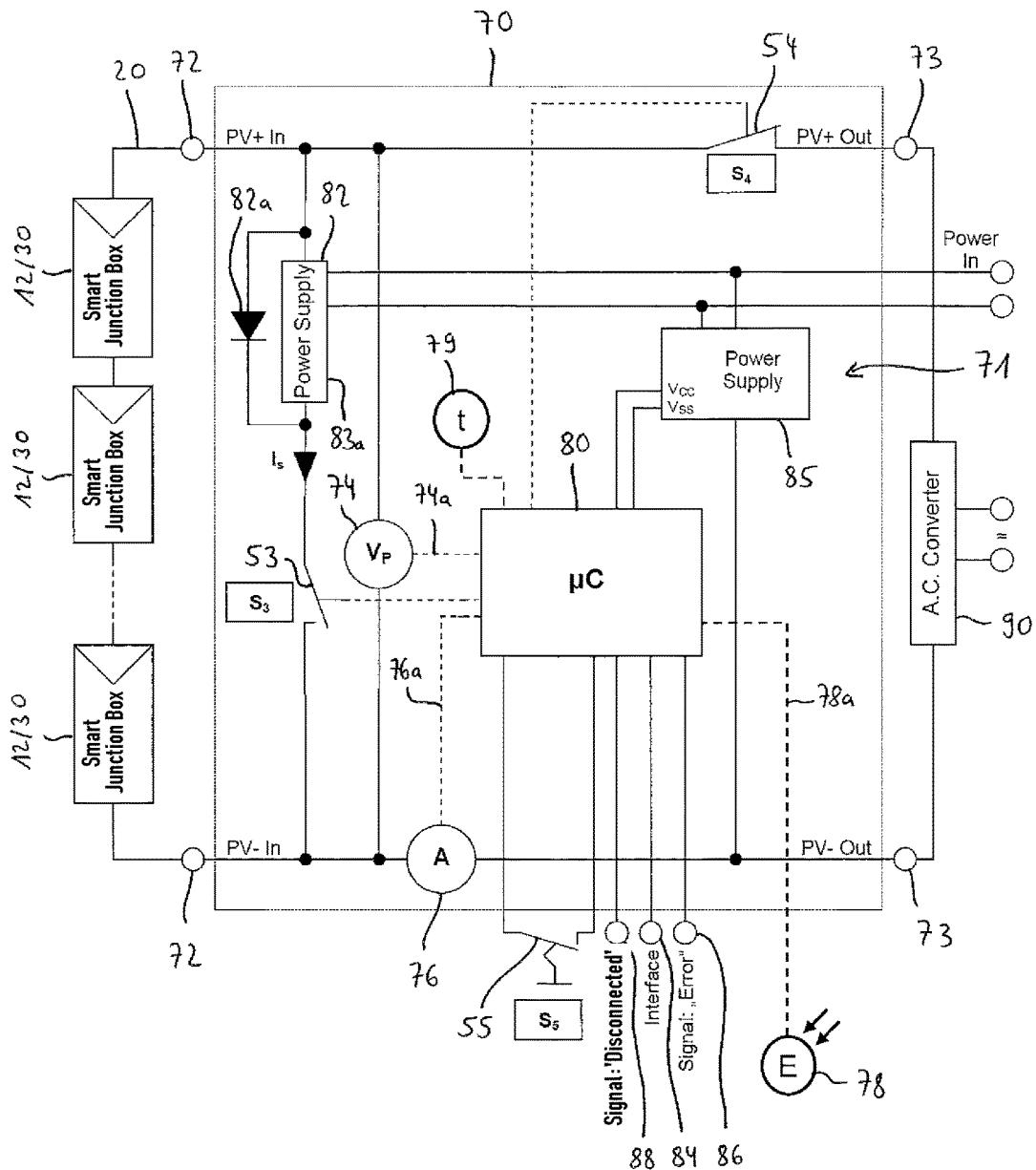
FIG. 4 shows a block diagram of a starter circuit comprising an own current source in the symbolized string that includes a plurality of solar modules.

Referring to FIG. 4, start box 70 is connected to string 20 comprising solar modules 30 and the associated smart solar junction boxes 12, and for normal operation of the photovoltaic system 1 start box 70 is in the state illustrated in FIG. 4. In this example, start box 70 is connected in both lines (positive and negative line) of the string—i.e. with two poles on both sides—in series between the series-connected solar modules 30 and inverter 90. To this end, start box 70 is connected to the solar generator consisting of solar modules 30 via two input terminals 72, and start box 70 is connected to the inverter, which is also referred to as a.c. converter in the figures, via the two output terminals 73. A voltage sensor 74 ($V_p$) measures the string voltage U3. A current sensor 76 (A) measures the current in the string, which may either be the photovoltaically generated solar current in the operating state, or the starting current in the safe state or starting mode. An irradiation sensor 78 measures the available light. A controller or microcontroller 80 is connected, via links 74a, 76a, 78a, to voltage sensor 74, current sensor 76, and irradiation sensor 78 to read them out in order to monitor the string voltage, the current in the string and the irradiation, and to control the starter circuit 71 in start box 70 in response to these measured data.

In the present example, the starter circuit comprises an internal current source 82 which has a diode 82a connected in parallel thereto in the forward direction with respect to the solar current. Microcontroller 80 controls an isolating switch 54 which is with respect to the string 20 comprising the solar modules 30 connected in parallel to the current source 82 and in series to the inverter 90, and/or a first switch 53 which is connected in series with respect to the string 20 comprising the solar modules 30 and to current source 82. In this example, current source 82 is provided as an internal power supply unit 83a of start box 70. In the operating state of photovoltaic system 1 illustrated in FIG. 4, the isolating switch 54 is closed and the first switch or shunt switch 53 connected in series with current source 82 is open, so that in this state the illustrated starter circuit 71 is virtually lossless and the photovoltaically generated current can flow through the starter circuit 71 to the inverter 90 almost without loss.

To start the string 20 or the smart solar junction boxes 12, isolating switch 54 is open and shunt switch 53 is closed. Now, the starting current $I_S$ generated by current source 82 is injected into string 20 for a predetermined time $t_S$. Here, the photovoltaic system 1, i.e. the smart solar junction boxes 12 will initially still be in the safe state, so that on the one hand the starting current injected into in the string can flow through the string, and on the other hand no photovoltaically generated current flows through the string in this example.

Thus, in the safe state the electrical circuit of string line 18 is closed, although the solar modules are individually disconnected, provided there is no error condition involved. With the starting current $I_S$ injected, a current flow through the closed string line is initiated which is measured or detected by current sensors 68. In response to this measurement or detection result, the safety circuits 13 will then automatically switch from the safe state to the operating state. Thus, the switching of safety circuits 13 from the safe state to the operating state can only occur when the electrical circuit of string line 18 is closed.

Once all smart solar junction boxes 12 have been activated in response thereto, i.e. have switched from the safe state to the operating state, shunt switch 53 is re-opened and isolating switch 54 is closed, so that then the photovoltaically generated current can flow through string 20 and the corresponding photovoltaic power can be fed into the power grid.

If the starting or the start sequence fails, it can be repeated automatically, again controlled by microcontroller 80. Since microcontroller 80 monitors and evaluates the string voltage and the string current using voltage sensor 74 and current sensor 76, the measured values can be used to calculate string power and to control the switching operations.

By using a manual enable switch 55 (S5) it is furthermore possible to manually initiate the starting operation at start box 70, i.e. to manually start the photovoltaic system 1 to set it from the safe state to the operating state.

An electronic interface 84 of microcontroller 80 allows to read out this information, for example by a computer. Microcontroller 80 further includes signaling means 86, 88, for example in form of light emitting diodes, which indicate a possible error state ("error") or the presence of the safe state ("disconnected") at start box 70.

The starting may as well be initiated via interface 84 ("interface") by a higher-level controller, or the digital port to which enable switch 55 is connected may be switched by a higher-level controller. In other words, a start command for injecting the starting current or start signal may be given via interface 84.

In everyday normal operation, the string is automatically started at sunrise by starter circuit 71, so that an adequate yield of the system is assured. This may be controlled or initiated at fixed points in time in response to a timer 79 or by reading out irradiation sensor 78, which are also part of the starter circuit 71 or are connected to microcontroller 80.

After sunrise, the microcontrollers 40 of the smart solar junction boxes 12 will be powered by the associated solar modules 30, so that the microcontrollers are enabled in terms of power supply to control the smart solar junction boxes even in the safe state that will initially still exist, in particular in order to switch from the safe state to the operating state.

For starting, the starter circuit 71 then injects the starting current $I_S$ from current source 82 into the string 20, with the isolating switch 54 already open or by opening the latter and by closing shunt switch 53, which starting current is detected by the smart solar junction boxes 12 which are still in the safe state, by means of current sensor 68, and in response thereto microcontroller 40 controls the smart solar junction boxes 12 to switch from the safe state to the operating state, in the present example by closing isolating switch 51 and by opening short-circuiting switch 52. In this manner it is ensured that the initiating of the starting process in the smart solar junction boxes 12 is only successful if the electrical circuit of string 20 is closed so that no hazardous open voltage can occur.

The starter circuit 71 with measuring devices 74 and 76 permits to measure voltage and current in the string 20 and to output the measured values via interface 84. Based on the individual measured values of voltage and current 74, 76, electrical power value can be calculated and is also provided via interface 84. Furthermore, the individual voltage and current values 74, 76 permit to monitor the functioning, and the result may also be provided via interface 84. Furthermore, optionally, the starter circuit 71 permits to detect arcing in the string 20 (the detection of arcing is not illustrated) and to output these values via interface 84. The circuit 71 also allows for theft detection in the string 20 and to output the result via interface 84.

Figure 6:
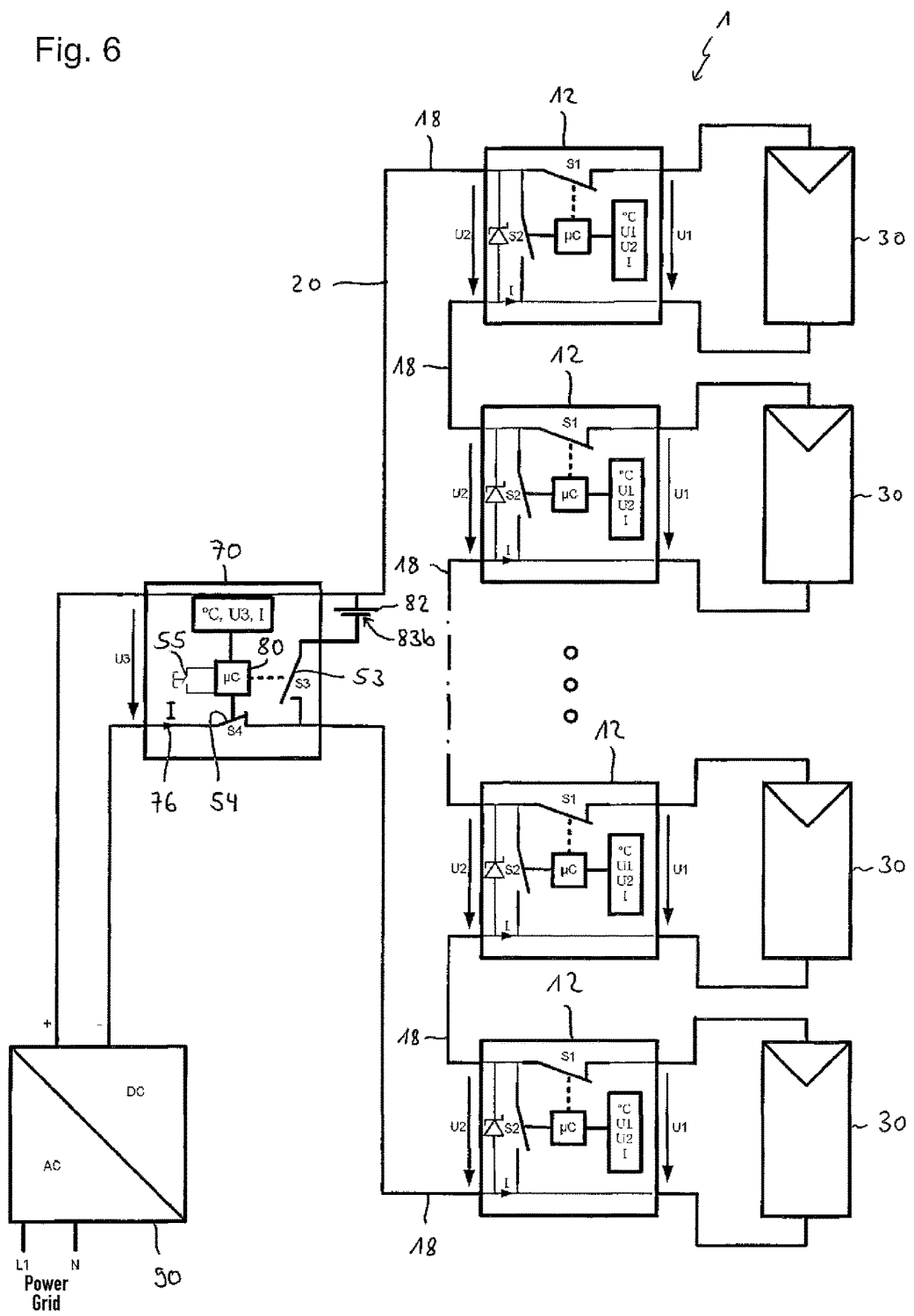
FIG. 6 shows an overview diagram of a string of the photovoltaic system including a plurality of solar modules having a smart solar junction box, inverter, and start box.

FIG. 6 shows an example of the connection of start box 70 to string 20 which includes a plurality of smart solar junction boxes 12. In contrast to the start box 70 of FIG. 4, the current source 82 is connected externally to start box 70. FIG. 6 illustrates the string 20 of photovoltaic system 1 in the operating state in which the smart solar junction boxes 12 are in the operating state and start box 70 is disabled or inactive by having the shunt switch 53 (S3) open and the isolating switch 54 (S4) closed.

In this example, all solar junction boxes 12 are "smart", so that the string 20 is automatically switched to zero voltage, i.e. is disconnected from voltage, at darkness, or is disconnected from voltage by the user in case of an error or incident or maintenance works. Therefore, the power supply for starter circuit 71 or starting current and for microcontroller 80 is provided, for example, by connection to the power grid, in the present example by an external power supply unit 83b as a current source 82. For injecting the starting current and thus for starting photovoltaic system 1, the isolating switch 54 (S4) is opened and the shunt switch 53 (S3) connected in series with current source 82 and string 20 is closed. Since shunt switch 53 (S3) connected in series with string 20 and solar modules 30 is connected in parallel to the inverter, the electrical circuit of string 20 is closed by bypassing the inverter 90, so that in the safe state the injected starting current can flow through the string 20 and the solar junction boxes 12. The injected starting current is measured or the start signal is detected in the smart solar junction boxes 12, and in response thereto the respective microcontroller 40 causes the smart solar junction boxes 12 to switch back from the safe state to the illustrated operating state.

In this example, the smart solar junction boxes 12 monitor (as symbolized) temperature ° C., module voltage U1, string voltage U2, and string current I. The smart solar junction boxes 12 are controlled in response to one or more of these measured values. Start box 70 also monitors the current I in the string, temperature ° C., and/or string voltage U3.

Figure 7:
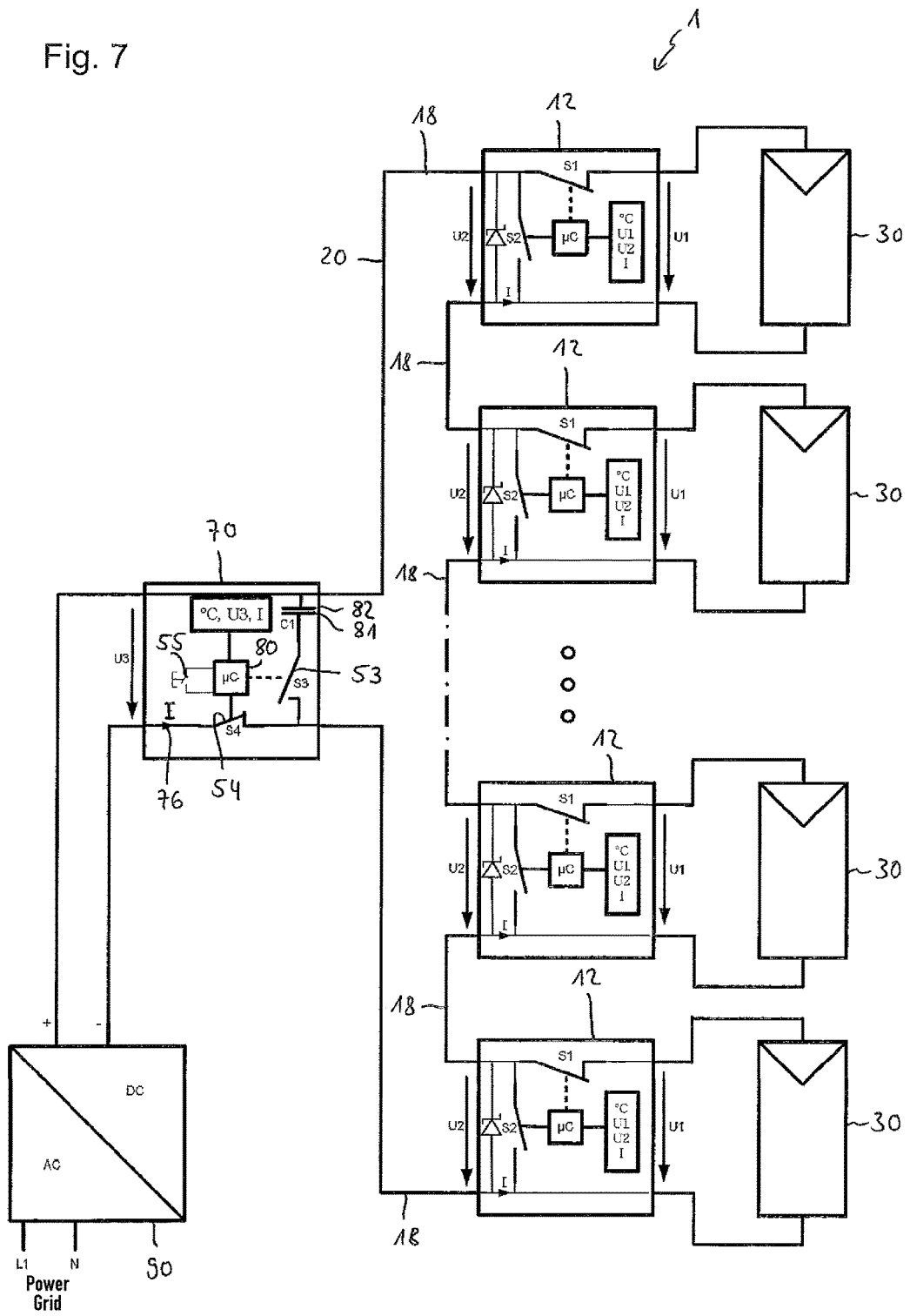
FIG. 7 is similar to FIG. 6, but with another embodiment of a start box.

FIG. 7 shows the string 20 again with only smart solar junction boxes 12 and with a slightly modified embodiment of start box 70. Instead of external power supply 83b as a current source 82 (FIG. 6), the start box 70 of FIG. 7 comprises an (internal) capacitor 81 (C1) as the current source 82. The safety circuits 13 of smart solar junction boxes 12 and the photovoltaic system 1 are started by means of shunt switch 53 (S3) as described below.

When voltage U3 at start box 70 falls below a lower threshold $U3_u$ and/or when microcontroller 80 receives a start signal, shunt switch 53 (S3) is closed and thus closes the electrical circuit of the string 20 through the smart solar junction boxes 12 and thereby starts the safety circuits 13 of smart solar junction boxes 12 and thus the photovoltaic system 1. During this starting process, the shunt switch 53 (S3) is closed at least until voltage U3 has exceeded an upper threshold $U3_o$ of e.g. 200 V, and is then re-opened. After that, capacitor 81 (C1) will have been recharged and is ready for the next start, which will occur when the voltage U3 again falls below the lower threshold U3, and/or the microcontroller again receives a start signal. Otherwise the start box 70 of FIG. 7 operates like the start box 70 of FIG. 6 with the permanent power supply by external power supply unit 83b, so that reference can be made thereto.

Figure 5:
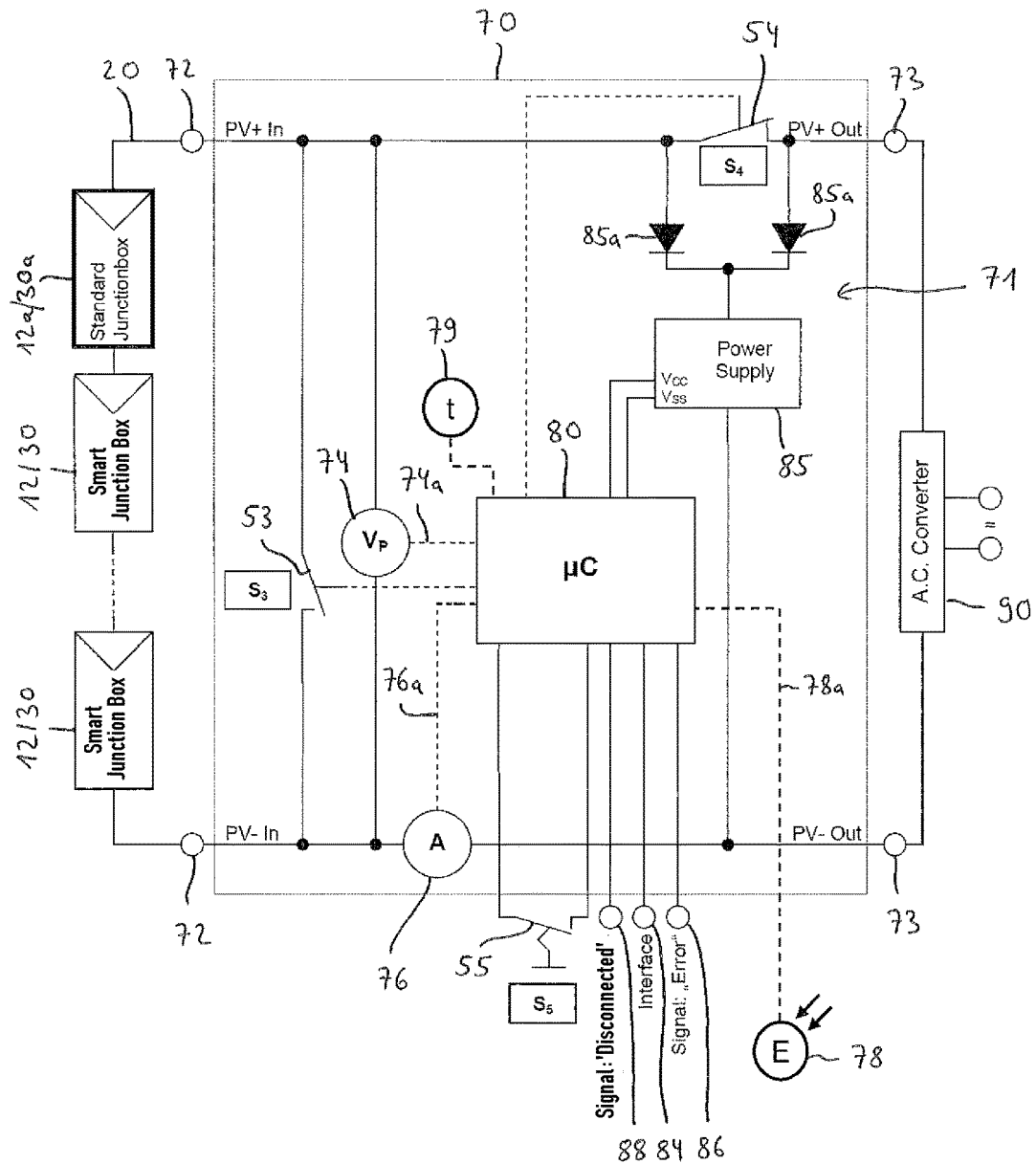
FIG. 5 shows a block diagram of a starter circuit without an own current source in the symbolized string that includes a plurality of solar modules.

FIGS. 5 and 8 show a further embodiment of the string 20 which comprises solar modules 30 having smart solar junction boxes 12 and one or more further solar modules 30a having simple conventional solar junction boxes 12a ("non-smart", i.e. without the safety circuit described above) which are not illustrated in FIG. 8 for the sake of clarity. In other words, the solar modules 30a are not individually switched on and off. The total voltage of the non-smart solar modules 30a can be kept below a voltage that would be hazardous when contacted. After sunrise, when the smart solar modules 30 are still disconnected from string 20, the non-smart solar module(s) 30a will nonetheless readily apply a voltage to the string 20.

Generally, in this embodiment, at least one solar module 30a has no smart solar junction box 12, so in normal operation it will supply the necessary voltage for operating the microcontroller 80 of start box 70 and to provide the starting current for the other, smart solar junction boxes 12 of string 20. Therefore, an own power supply unit 83a, 83b of the start box can be dispensed with. In this case, the power supply 85 of microcontroller 80 is fed by the solar power from non-smart solar module(s) 30a via diodes 85a connected in the forward direction. This translates into reduced costs for purchase, installation, and maintenance.

Figure 8:
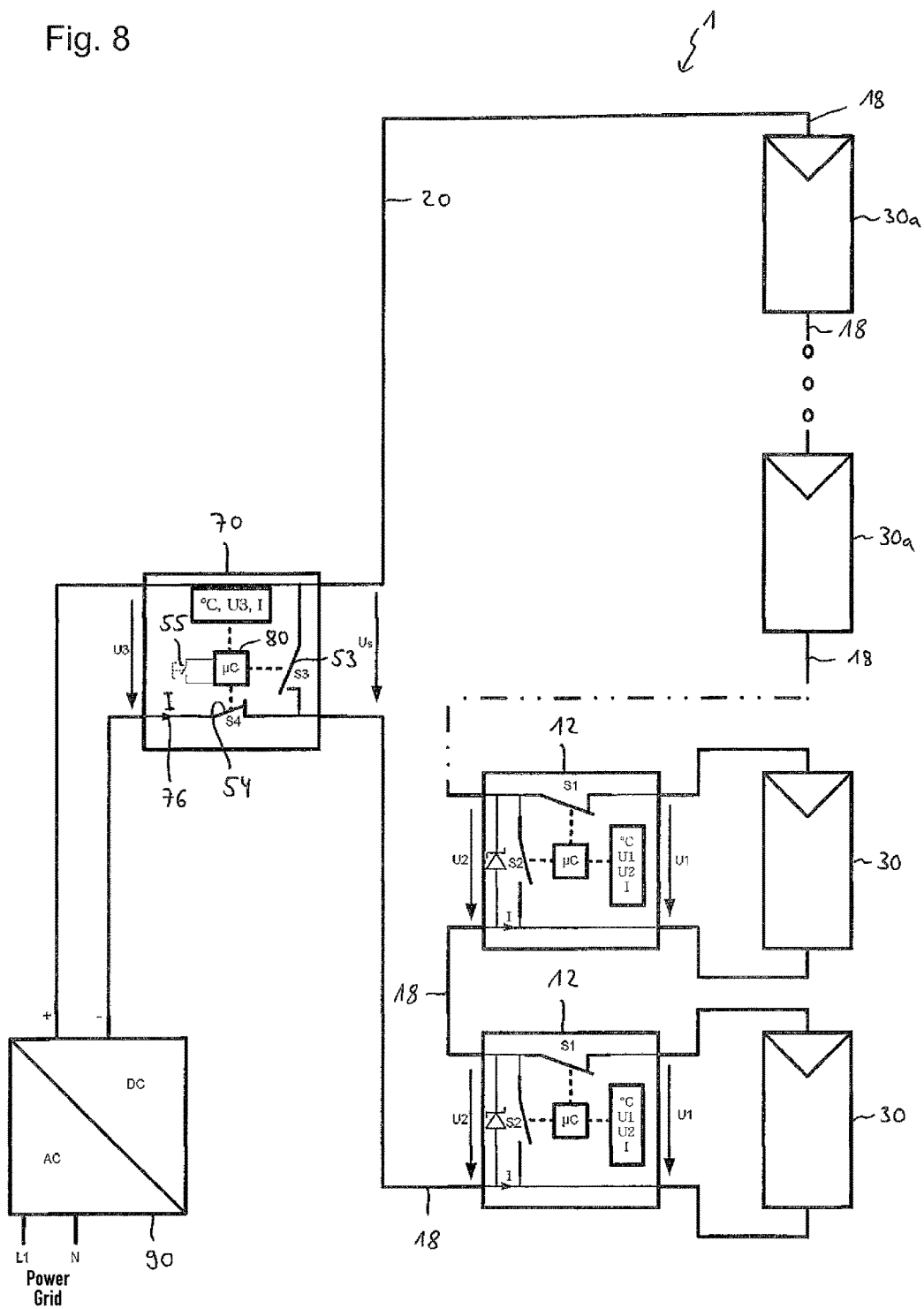
FIG. 8 is similar to FIG. 7, with yet another embodiment of the start box, and partially with solar modules having non-smart solar junction boxes.

In the simple example illustrated in FIGS. 5 and 8, when the smart solar junction boxes 12 are in the safe state illustrated in FIG. 3, for starting the string the shunt switch 53 (S3) in start box 70 which is connected in series with the string 20 comprising solar modules 30, 30a is closed, so that the electrical circuit of string 20 is closed and the current photovoltaically generated by non-smart solar modules 30a flows through string 20 and provides the starting current. Thus, here again, shunt switch 53 closes the electrical circuit that comprises solar modules 30, 30a by bypassing the inverter 90 in order to inject the starting current or start signal into the string line.

Figure 9:
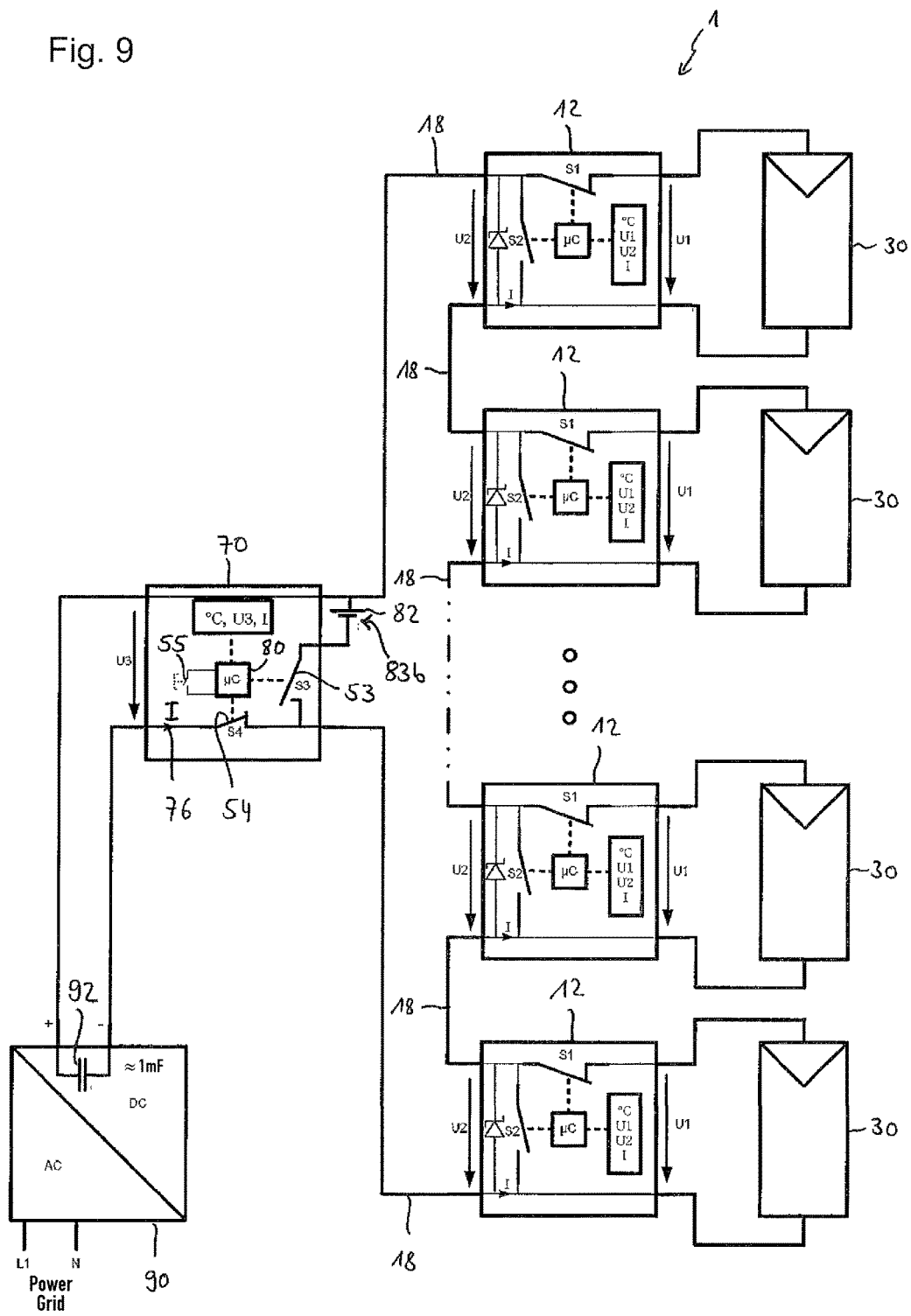
FIG. 9 is similar to FIG. 6, with a further embodiment of the start box, and with an inverter having an input capacitor.

FIG. 9 shows a further embodiment of the string 20, in which the inverter 90 is activated by pulses. The inverter 90 has an input capacitor 92 of about 1 mF on the DC side. Inverter 90 has a start-up behavior configured so that when a sufficiently high string voltage is available, the inverter 90 performs a DC line test and subsequently a solar line side load test. To this end, the impedance of the inverter is reduced until, due to the load, the voltage according to the operating point of the solar generator has reduced to a value below the open circuit voltage. When now a value of the product of current and voltage is produced which is above an inverter-specific threshold, the string will start the production of photovoltaically generated power which is fed into the power grid. This means that a high-impedance basic behavior exists during the start-up of inverter 90. Furthermore, the inverter 90 needs a certain time, for example for an earth measurement.

According to the present disclosure the start box 70 will then disconnect the shunt from the PV line or the string 20 when a detected string voltage U3 is above the switching threshold of start box 70. At the inverter 90 the total voltage of the solar modules 30 is applied, which is sufficient to start the solar power system. If now the current flow in string 20b is interrupted due to a malfunction of the inverter 90, the start-up process can be repeated. This may be effected automatically by the microcontroller 80 of start box 70 or by an external controller, for example via interface 84, or via the external enable switch 55 (S5), which may optionally be connected to a control center.

In this embodiment, the operation sequence is as follows:
1) Start box 70 is enabled by closing the shunt switch 53 (S3);
2) Starting current $I_{const}$ is injected into the string 20 from the current source 82 (here: external power supply unit 83b);
3) When the starting voltage is reached at inverter 90, start box 70 is switched off by re-opening the shunt switch 53 (S3);
4) The isolating switch 54 (S4) of start box 70 is opened and closed in clocked manner, and capacitor 92 of the inverter is recharged until the charge/discharge curve becomes flat (e.g. <5 V/s).

As a starting current, 500 mA are fed at a voltage of 24 V, for example. When voltage U3 exceeds a predetermined threshold, e.g. becomes greater than 100 V, the shunt switch 53 (S3) is opened.

Figure 10A:
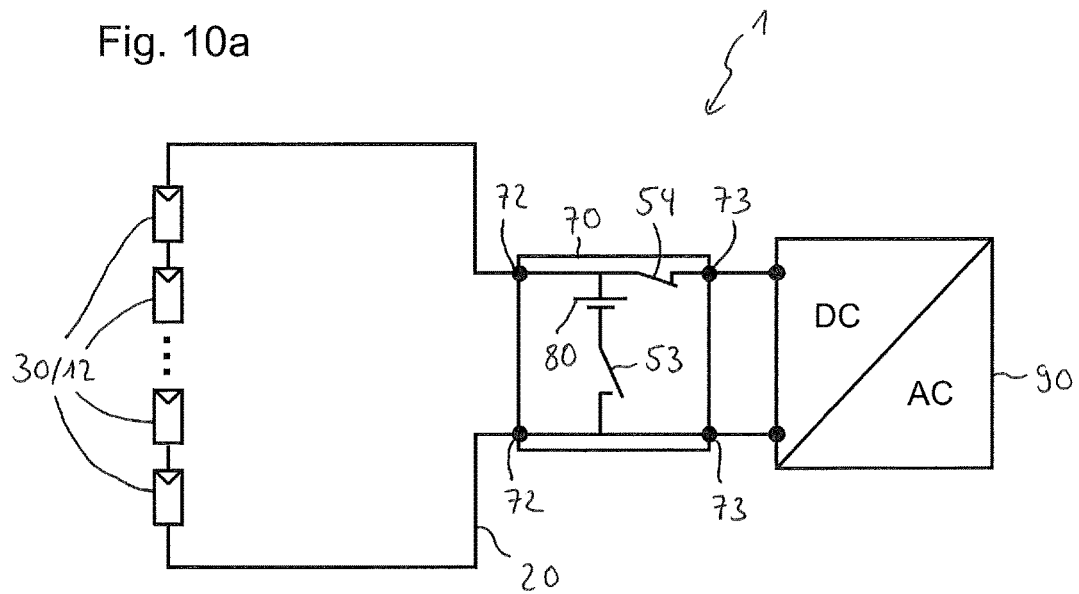
FIG. 10a shows a simplified schematic block diagram illustrating the connection of the start box of FIG. 4, in the operating state of the photovoltaic system.
Figure 10B:
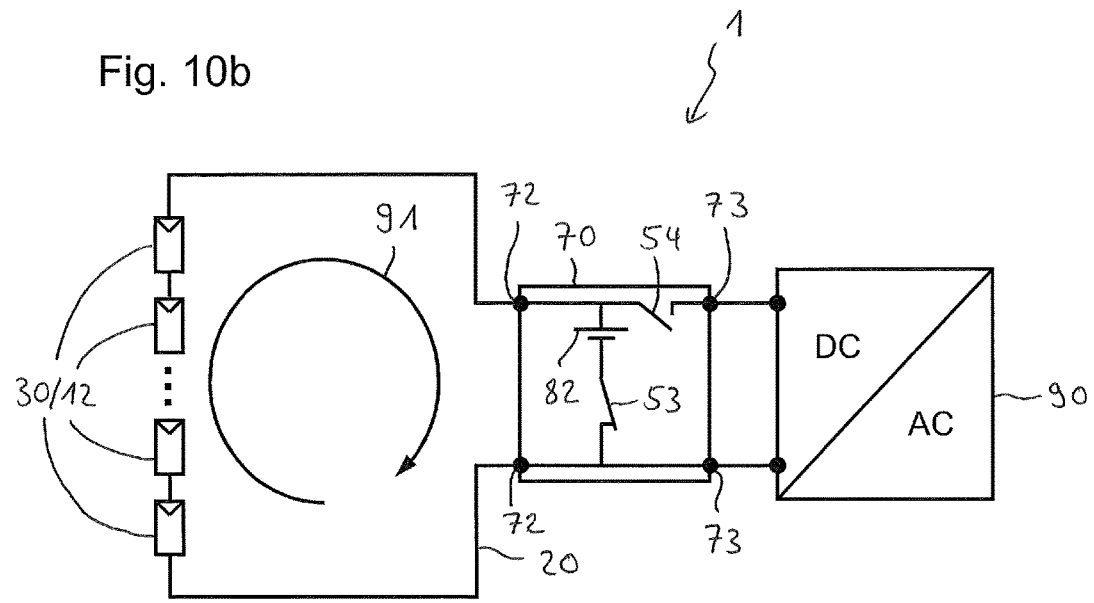
FIG. 10b is similar to FIG. 10a, but with the start box in the starting mode.

FIGS. 10a/b show a simplified block diagram of the string 20 with start box 70 of FIG. 4. FIG. 10a shows the operating state of the photovoltaic system 1 with shunt switch 53 open and isolating switch 54 closed. FIG. 10b shows the photovoltaic system 1 with start box 70 in the starting mode, in which shunt switch 53 is closed and isolating switch 54 is open.

Shunt switch 53 is connected in series with current source 82, and when the shunt switch 53 is closed start box 70 forms an electrical circuit 91 with the solar modules 20 by bypassing the inverter 90. Thus, with the shunt switch 53 closed, start box 70 forms a temporary shunt to inverter 90 which is disconnected from the string by means of isolating switch 54. In other words, in the starting mode the start box 70 defines a shunt current source (FIG. 10b).

When shunt switch 53 is open, the shunt switchable by start box 70 is open, and the normal electrical circuit for the operating state of photovoltaic system 1 is formed by the series-connected solar modules 20 and the inverter 90, with the isolating switch 54 closed (FIG. 10a).

Switches 51, 52 (S1, S2) of the smart solar junction boxes 12 and/or switches 53, 54 (S3, S4) of start box 70 may be relays, semi-conductor switches, in particular field-effect transistors.

Figure 11:
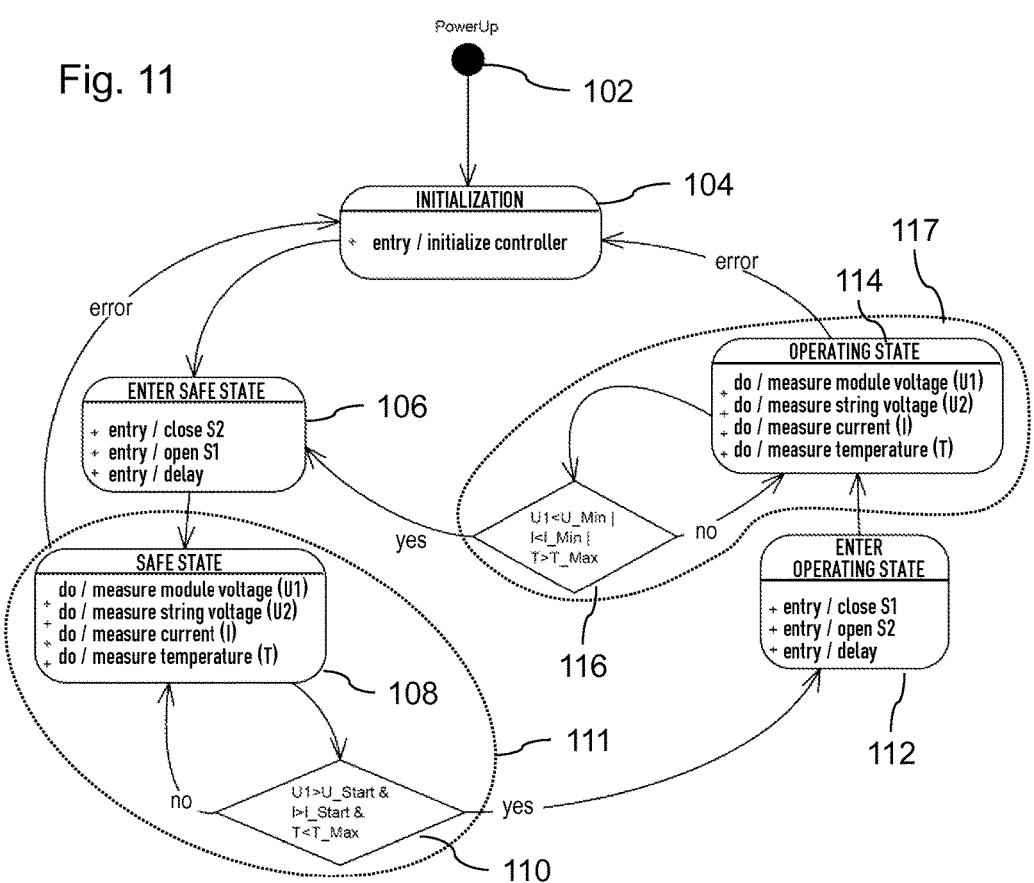
FIG. 11 is a flow chart illustrating the controlling in the smart solar junction box.

FIG. 11 shows an exemplary embodiment of a control algorithm for the smart solar junction boxes 12. After a "Power-up" 102, microcontroller 40 is initialized in a start step 104. Then, the safe state is again ensured in a step 106 by entries for closing the short-circuiting switch 52 and for opening the isolating switch 51. Then a short delay follows. In step 108, module voltage U1, string voltage U2, the current at sensor 68, and the temperature at temperature sensor 94 are measured. A test step 110 checks whether the module voltage U1 exceeds a threshold U_Start for starting and whether the current at sensor 68 exceeds a threshold I_Start and whether the temperature is below a certain threshold T_max. Unless all three criteria are met, smart solar junction box 12 remains within control loop 111 of the safe state which is defined by steps 108, 110.

When the three criteria of test step 110 are met, the microcontroller 40 closes the isolating switch 51, opens the short-circuiting switch 52, and again a certain delay follows. In the operating state, step 114, module voltage U1, string voltage U2, string current I, and temperature T are again measured using sensors 36, 66, 68, 94. Test step 116 checks whether the module voltage U1 is below a threshold U_min, or whether the string current I is below a threshold I_Min, or whether the module temperature T is above a threshold T_max. If this OR operation gives a No, the smart solar junction box 12 remains in the control loop 117 of the operating state. Control loop 117 is defined by steps 114, 116. If one of the OR-ed conditions in step 116 is true, step 106 is executed again, i.e. the initiating of the safe state. Furthermore, error messages may be issued in the safe state 111 and in the operating state 117, which will again trigger initialization 104. Moreover, it can be seen that the operating state 117 and/or the safe state 111 include active control loops in which the measured values, e.g. the injected starting current or the start signal, the module voltage U1, the string voltage U2, and/or the temperature T are queried in order to trigger the switching operations in response to these values.

In summary, a technique is presented which switches smart solar junction boxes 12 in a photovoltaic system 1 from the safe state to the operating state after a shutdown or at sunrise, so assuring appropriate yield of the system. In the safe state the output of the smart solar junction boxes 12 is short-circuited, so that a current can flow through the string 20, but no voltage is present. The switching of the individual safety circuits 13 of the solar junction boxes 12 from the safe state to the operating state occurs automatically in response to a measurement or detection of the starting current $I_S$ flowing through the closed string line. Thus, the present disclosure not only provides for individually disconnecting or deactivating and reconnecting or restarting of the solar modules 20 but in particular ensures that the solar modules 20 can only be connected or started when the electrical circuit of string line 18 is closed so that no hazardous open voltages can occur. The operating state of the PV system 1 is inherently stable as long as the PV system 1 generates sufficient solar power. That means, once the PV system 1 has been started the safety circuits 13 will remain in the operating state as long as the solar power and/or solar voltage generated by PV system 1 exceed predefined thresholds, without need of the starter circuit 71. In other words, starter circuit 71 serves to safely start the PV system 1 but is not required to keep PV system 1 in the operating state after it has been started. Therefore, once the PV system 1 has been brought to the operating state, starter circuit 71 can be disabled, for which purpose the starter circuit 71 is switched to passage by opening shunt switch 53 (S3) and closing isolating switch 54 (S4), in this example. In the operating state no electronic components of the starter circuit 71 which might generate power loss or power consumption are required in the serial string. In this way, failure susceptibility, power loss and energy consumption can be reduced.

It will be apparent to those skilled in the art that the embodiments described above are meant to be exemplary and that the invention is not limited thereto but may be varied in many ways without departing from the scope of the claims. Furthermore, it will be apparent that the features individually define components of the present disclosure, irrespective of whether they are disclosed in the description, the claims, the figures, or otherwise, even if they are described together with other features.

The invention claimed is:

1. A photovoltaic system comprising at least one string of series-connected solar modules and adapted for individually disconnecting the solar modules and for safely connecting or reconnecting the disconnected solar modules to the string, comprising:
 a plurality of solar modules each one comprising a solar junction box, wherein said solar junction boxes each have input-side positive and negative connection elements connected to the voltage-carrying conductors of the positive and negative poles of the associated solar module, and each have positive and negative output-side connection elements;
  wherein the solar modules are connected in series to form said string by means of a string line connected to said output-side positive and negative connection elements;
  wherein at least one of said solar junction boxes includes a safety circuit which comprises a short-circuiting switch between the output-side positive and negative connection elements and an isolating switch connected in series into the string, and which defines an operating state in which with the isolating switch closed and the short-circuiting switch open the solar power produced by the associated solar module is supplied from the solar junction box via the string line, and which defines a safe state in which with the isolating switch open and the short-circuiting switch closed the associated solar module is disconnected with respect to the string line by means of the safety circuit while the string line is nevertheless closed via the closed short-circuiting switch;
 a starter circuit connected to the string line and adapted to inject a starting current into an electrical circuit in the string line that is closed via the closed short-circuiting switch;
 wherein the safety circuit includes a current sensor and is adapted to automatically switch from the safe state to the operating state in response to the starting current which flows through the electrical circuit in the string line that is closed by means of the short-circuiting switch and which is measured or detected by the current sensor.

2. The photovoltaic system as claimed in claim 1, wherein the starter circuit is accommodated in a start box which is connected to the string line separately from the solar modules.

3. The photovoltaic system as claimed in claim 1, wherein the starting current comprises a constant current and/or one or more current pulses flowing through the string line that is closed by means of the short-circuiting switch.

4. The photovoltaic system as claimed in claim 1, wherein the safety circuit comprises a control device which is responsive to the starting current injected into the string line to close the isolating switch and/or to open the short-circuiting switch.

5. The photovoltaic system as claimed in claim 4, wherein in the safe state the control device is powered by the associated solar module when the associated solar module is illuminated by light, so that the control device can switch the safety circuit from the safe state to the operating state.

6. The photovoltaic system as claimed in claim 1, wherein in the safe state the current sensor measures or detects the injected starting current, and in the operating state it measures the solar current fed into the string.

7. The photovoltaic system as claimed in claim 1, wherein the safety circuit is adapted so as to automatically switch from the operating state to the safe state when the associated solar module is shadowed or in case of general darkness and the associated drop of module voltage.

8. The photovoltaic system as claimed in claim 1, wherein the solar junction box comprises at least one of the following devices:
 a first voltage sensor which measures the module voltage of the associated solar module;
 a second voltage sensor which measures the string voltage;
 a temperature sensor which monitors the temperature of the associated solar module;
  wherein said control device is adapted to read out the first voltage sensor and/or the second voltage sensor and/or the temperature sensor and to control the safety circuit in response thereto.

9. The photovoltaic system as claimed in claim 1, wherein all solar modules of a string comprise a solar junction box including the safety circuit that defines an operating state in which the solar power produced by the associated solar module is supplied from the solar junction box to the power grid via the string line, and that defines a safe state in which the associated solar module is disconnected from voltage with respect to the string line.

10. The photovoltaic system as claimed in claim 1, wherein the starter circuit comprises at least one first switch by means of which an electrical circuit in the string can be closed to start the string.

11. The photovoltaic system as claimed in claim 1, wherein the starter circuit comprises a current source which supplies the starting current injected into the string line.

12. The photovoltaic system as claimed in claim 11, wherein the first switch connects the current source for injecting the starting current to the string.

13. The photovoltaic system as claimed in claim 1, wherein the starter circuit comprises at least one isolating switch by means of which an inverter is disconnectable from the string for starting the string.

14. The photovoltaic system as claimed in claim 10, wherein during normal operation of the photovoltaic system during which the safety circuits of the solar junction boxes are in the operating state, the isolating switch of the starter circuit is closed and/or the first switch of the starter circuit is open.

15. The photovoltaic system as claimed in claim 1, wherein the starter circuit comprises a controller having an interface and/or an external enable switch, and wherein the controller is responsive to an activation signal at the interface and/or is responsive to an actuation of the enable switch and/or is responsive to a signal of an irradiation sensor and/or is responsive to a timer to control the injection of the starting current into the string line.

16. The photovoltaic system as claimed in claim 15, wherein the controller has at least one signal output which signals the safe state, the operating state, and/or an error state.

17. The photovoltaic system as claimed in claim 1, wherein the starter circuit comprises at least one of the following components:
 a current sensor for measuring a string current; and/or
 a voltage sensor for measuring a string voltage; and/or
 means for determining a string power; and/or
 an irradiation sensor;

a timer;

means for detecting arcing in the string; and/or means for theft detection in the string; and/or an interface to output the respective values or an appropriate signal.

18. The photovoltaic system as claimed in claim 1, wherein at least one solar module of a string has a solar junction box without the safety circuit so that this solar module will not be placed in a safe state and the solar voltage supplied by this solar module is used for injecting the starting current into the string line to cause the safety circuits of the other solar modules to switch from the safe state to the operating state.

19. A start box comprising a starter circuit adapted for being connected to the string line of a photovoltaic system as claimed in claim 1, and for injecting the starting current into the electrical circuit in the string line to cause the safety circuit to switch from the safe state to the operating state.

20. A smart solar junction box for being electrically connected to a solar module and for being connected to the string line of a photovoltaic system as claimed in claim 1, comprising:

input-side positive and negative connection elements for connecting the voltage-carrying conductors of the positive and negative poles of the associated solar module and respective output-side positive and negative connection elements for connecting the string line;

a safety circuit which comprises a short-circuiting switch between the output-side positive and negative connection elements and an isolating switch connected in series into the string, and which defines an operating state in which with the isolating switch closed and the short-circuiting switch open the solar power produced by the associated solar module is supplied from the solar junction box via the string line, and which defines a safe state in which with the isolating switch open and the short-circuiting switch closed the associated solar module is disconnected with respect to the string line by means of the safety circuit while the string line is nevertheless closed via the closed short-circuiting switch; wherein the safety circuit includes a current sensor and is adapted to automatically switch from the safe state to the operating state in response to a starting current which is injected into the string line and which flows through the string line, wherein an electrical circuit in the string line is closed by means of the short-circuiting switch, and wherein the starting current is measured or detected by the current sensor.

21. A solar module comprising a smart solar junction box as claimed in claim 20 mounted thereto.

22. A method for safely starting a string of series-connected solar modules of a photovoltaic system, in particular a photovoltaic system including at least one string of series-connecter solar modules and adapted for individually disconnecting the solar modules and for safely connecting or reconnecting the disconnected solar modules to the string, and comprising:

a plurality of solar modules each one comprising a solar junction box, wherein said solar junction boxes each have input-side positive and negative connection elements connected to the voltage-carrying conductors of the positive and negative poles of the associated solar modules, and each have positive and negative output-side connection elements, wherein the solar modules are connected in series to form said string by means of a string line connected to said output-side positive and negative connection elements, wherein at least one of said solar junction boxes includes a safety circuit which comprises a short-circuiting switch between the output-side positive and negative connection elements and an isolating switch connected in series into the string, and which defines an operating state in which with the isolating switch closed and the short circuiting switch open the solar power produced by the associated solar module is supplied from the solar junction box via the string line, and which defines a safe state in which with the isolating switch open and the short-circuiting switch closed the associated solar module is disconnected with respect to the string line by means of the safety circuit while the string line is nevertheless closed via the closed short-circuiting switch; and a starter circuit connecter to the string line and adapted to inject a starting current into an electrical circuit in the string line that is closed via the closed short-circuiting switch, wherein the safety circuit includes a current sensor and is adapted to automatically switch from the safe to the operating state in response to the stating current which flows through the electrical circuit in the string line that is closed by means of the short-circuiting switch and which is measured or detected current sensor;

wherein the safety circuits define a safe state in which the solar modules are individually disconnected from voltage with respect to the string line while the string line is nevertheless closed in case of fault-free operation, comprising the steps of:

injecting a starting current into the closed electrical circuit in the string line;

measuring or detecting the starting current flowing through the closed electrical circuit in the string line; and automatically connecting the solar modules to the string by means of the safety circuit of the associated solar junction box in response to the result of measuring or detecting the starting current flowing through the electrical circuit in the string line so as to ensure that the string line is closed and no open voltage can occur when the generated solar power is supplied via the string following an automatic connection of the solar modules.

23. The method as claimed in claim 22, wherein the injecting of the starting current is controlled by a central start box connected to the string in response to:

manual actuation of an enable switch on the start box; and/or remotely controlled starting of the starter circuit by transmitting a start signal to an interface of the controller of the starter circuit; and/or automatically starting in response to a timer; and/or automatically starting in response to an evaluation of an irradiation sensor connected to the starter circuit of the start box.

24. The method as claimed in claim 22, wherein the starting current injected into the string line is supplied by:

an own current source of the starter circuit; and/or a solar module of the string, that has a solar junction box without the safety circuit so that this solar module is not set to a safe state.

25. The method as claimed in claim 22, wherein for connecting the solar junction boxes to the string, one or more of the following steps are performed in the starter circuit:
- opening the isolating switch of the start box to disconnect an inverter;
- closing the first switch of the start box to close the electrical circuit of the string through the starter circuit and injecting the starting current into the string line;
- measuring the string voltage in the start box;
- when the string voltage exceeds a predefined threshold, disconnecting the current source from the string to stop injecting the starting current into the string;
- closing the isolating switch to connect the inverter to the string.

26. A photovoltaic system comprising at least one string of series-connected solar modules and adapted for individually disconnecting the solar modules and for safely connecting or reconnecting the disconnected solar modules to the string, comprising:
- a plurality of solar modules each one comprising a solar junction box, wherein said solar junction boxes each have input-side positive and negative connection elements connected to the voltage-carrying conductors of the positive and negative poles of the associated solar module, and each have positive and negative output-side connection elements;
- wherein the solar modules are connected in series to form said string by means of a string line connected to said output-side positive and negative connection elements;
- wherein at least one of said solar junction boxes includes a safety circuit which defines an operating state in which the solar power produced by the associated solar module is supplied from the solar junction box via the string line, and which defines a safe state in which the associated solar module is disconnected with respect to the string line by means of the safety circuit;
- a starter circuit connected to the string line and adapted to inject a starting current or a start signal into an electrical circuit in the string line;
- wherein the safety circuit includes a current sensor and is adapted to switch from the safe state to the operating state in response to the starting current injected into the electrical circuit in the string line.

* * * * *